(12) United States Patent
Borodovsky et al.

(10) Patent No.: US 7,245,352 B2
(45) Date of Patent: Jul. 17, 2007

(54) ALIGNMENT USING LATENT IMAGES

(75) Inventors: Yan Borodovsky, Portland, OR (US);
Ilya Grodnensky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 10/895,651

(22) Filed: Jul. 20, 2004

(65) Prior Publication Data

US 2006/0017901 A1 Jan. 26, 2006

(51) Int. Cl.
G03B 27/32 (2006.01)
G03B 27/54 (2006.01)

(52) U.S. Cl. .......................................... 355/67; 355/77

(58) Field of Classification Search ................. 355/67, 355/53, 71, 77
See application file for complete search history.

(56) References Cited

U.S. PATENT DOCUMENTS

| | | | | |
|---|---|---|---|---|
| 5,140,366 A | * | 8/1992 | Shiozawa et al. | 355/53 |
| 5,160,957 A | * | 11/1992 | Ina et al. | 355/43 |
| 5,262,822 A | * | 11/1993 | Kosugi et al. | 355/53 |
| 6,097,473 A | * | 8/2000 | Ota et al. | 355/53 |
| 6,118,577 A | * | 9/2000 | Sweatt et al. | 359/351 |
| 6,458,605 B1 | | 10/2002 | Stirton | |
| 6,498,640 B1 | | 12/2002 | Ziger | |
| 2001/0019412 A1 | | 9/2001 | David | |
| 2002/0080364 A1 | | 6/2002 | Monshouwer et al. | |
| 2003/0064307 A1 | | 4/2003 | Nakamura et al. | |

OTHER PUBLICATIONS

Huang, H., et al., "Scatterometry-Based Overlay Metrology", *Proc. SPIE*, Metrology, Inspection, and Process Control for Microlithography XVII, Feb. 2003, pp. 1-12, vol. 5038 (paper 5038-132), SPIE, Santa Clara, California.
Niu, X., et al., "Specular Spectroscopic Scatterometry in DUV Lithography", *Proc. SPIE*, Metrology, Inspection, and Process Control for Microlithography XIII, Mar. 1999, pp. 159-168, vol. 3677, SPIE, Santa Clara, California.
Cho, Hyungsuck, Ed., *Opto-Mechatronic Systems Handbook: Techniques and Applications*, CRC Press LLC, pp. 17-13 and 17-14 (2003).
Rees, W.G., *Physical Principles of Remote Sensing*, 2$^{nd}$ Ed, Cambridge University Press, pp. 217-222 (2001).

* cited by examiner

*Primary Examiner*—Rodney Fuller
(74) *Attorney, Agent, or Firm*—Fish & Richardson P.C.

(57) ABSTRACT

Systems and techniques for alignment with latent images. In one implementation, a method includes detecting a location of a latent image on a substrate, repositioning the substrate based on the detected location of the latent image, and patterning the substrate.

30 Claims, 6 Drawing Sheets

ALIGNMENT USING LATENT IMAGES

BACKGROUND

This disclosure relates to alignment using latent images.

In order to successively pattern a substrate using lithography or other fabrication processes, the features in each pattern must generally be properly aligned relative to the features of both prior and successive patterns. Misalignment between features in different patterns is generally termed "overlay error" and can be caused, e.g., by reticle misalignment, reticle-to-wafer misalignment, uncompensated rotation of the wafer and/or reticle, uncompensated physical changes in the wafer, and other discrepancies.

Many systems for patterning substrates include one or more alignment devices to minimize overlay error. For example, a patterning system can include a wafer pre-aligner that receives a semiconductor wafer and coarsely aligns the wafer (e.g., to within +/−10 μm or so) such that alignment marks on the wafer are within the capture range of finer alignment devices. Examples of such finer alignment devices include wafer alignment systems that compare the intended and actual location of the wafer after pre-alignment and correct wafer misalignment down to fractions of micrometers. The accuracy of such systems is typically below 300 nm, but some commercial systems can achieve accuracies below 50 nm.

DESCRIPTION OF DRAWINGS

Like reference symbols in the various drawings indicate like elements.

DETAILED DESCRIPTION

Figure 1:
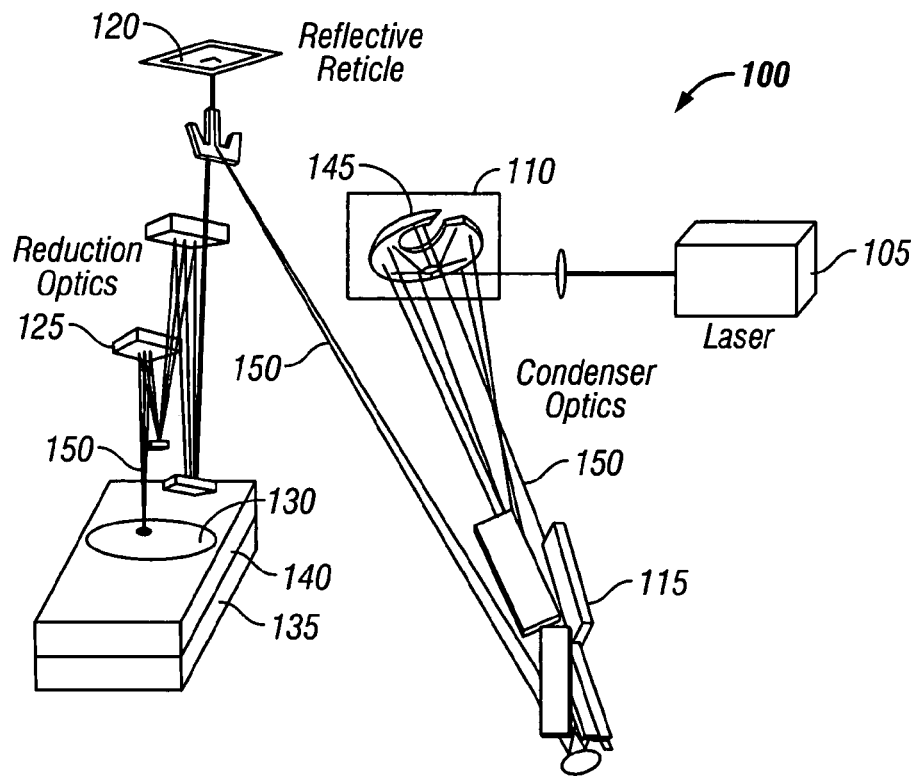
FIG. 1 shows a system for patterning a substrate.

FIG. 1 shows a system for patterning a substrate, namely a reflective exposure system 100. System 100 includes a laser 105, an exposure radiation source chamber 110, condenser optics 115, a reflective reticle 120, projection optics 125, a substrate 130, a coarse alignment stage 135, and a fine alignment stage 140. System 100 may also include one or more blinds to block the optical paths within system 100.

Laser 105 acts as an energy source to excite a plasma in source chamber 110 to emit an electromagnetic radiation that is suited for exposing an energy-sensitive material, such as a photosensitive material like a photoresist. For example, laser 105 can be a pulsed or continuous laser. Source chamber 110 includes the excited plasma, along with collector optics 145 to collect and direct the emitted electromagnetic radiation out of source chamber 110 and along an optical path 150 that exposes substrate 130. In one implementation, source chamber 110 also encompasses laser 105. The electromagnetic radiation emitted from source chamber 110 can be extreme ultraviolet (EUV) light.

Condenser optics 115 shape and collimate the radiation from source chamber 110 and direct the shaped, collimated radiation to reflective reticle 120. Reflective reticle 120 reflects at least a portion of this radiation. Projection optics 110 may include reduction optics for exposure projection of the reflected radiation with a pre-determined reduction ratio. Together, reflective reticle 120 and projection optics 110 influence the intensity, phase, and/or propagation direction of the reflected radiation to expose a desired intensity pattern at substrate 130.

Substrate 130 can include one or more alignment marks and one or more energy-sensitive (e.g., photosensitive) materials that are exposed by the intensity pattern. For example, substrate 130 can be a wafer that includes a grating alignment mark beneath one or more photoresist layers, as discussed further below.

Alignment and scanning stages 135, 140 support and position substrate 130 in system 100. For example, stage 140 can include a wafer chuck to present a wafer substrate to system 100. Both stages 135, 140 can also change the position of substrate 130 within exposure system 100. Stages 135, 140 can be controlled individually or jointly by one or more alignment devices such as a pre-aligner and an alignment system.

Figure 2:
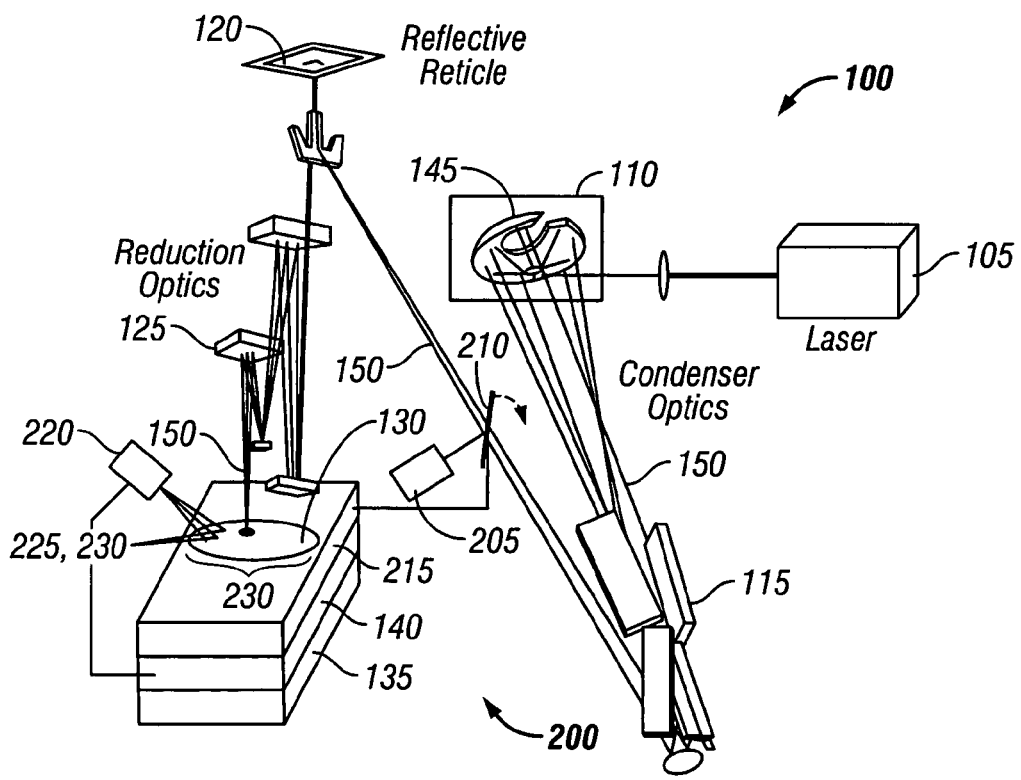
FIG. 2 shows a system for patterning a substrate that includes a latent image alignment system.

FIG. 2 shows a reflective exposure system 100 that includes elements to implement a latent image alignment system 200. System 200 can detect interactions between a probe electromagnetic radiation, an alignment mark, and a latent image in a substrate to align substrate 130 for successive patterning.

A latent image is a spatial distribution in material properties that results from the directed exposure of an energy-sensitive medium by an exposing energy. Latent images will generally emerge after development of the energy-sensitive medium. The most common energy-sensitive media are photosensitive media such as photoresists that are exposed by electromagnetic radiation, and this terminology is used subsequently. Latent images in photoresists are generally spatial variations of chemical species. The various chemical species are generated by directed exposure to electromagnetic radiation. The various chemical species can include polymerization products and ionization or other photo-induced degradation products.

System 200 can be a scatterometry system that detects interaction between a probe electromagnetic radiation, alignment marks, and latent images. Scatterometry is a technique for determining the geometry and arrangement of a specimen from the optical response of the specimen. The optical response of the specimen can be measured using, e.g., a reflectometer or an ellipsometer to identify interactions between the probe electromagnetic radiation and the specimen. In some implementations, the frequency of the probe radiation can be varied for spectroscopic scatterometry measurements.

System 200 includes a probe radiation source 205, a movable mirror 210, a probe radiation detector 215, and an interaction detector 220. System 200 can align one or more latent images 225 and alignment marks 230 in substrate 130 relative to the path 150 of exposure radiation, as discussed further below.

Probe radiation source 205 generates a probe electromagnetic radiation that is used to probe substrate 130. For example, source 205 can be a laser or other collimated light source that generates radiation of a wavelength that scatters off latent images 225 and alignment marks 230 in substrate 130. The probe radiation generated by source 205 can have a longer wavelength than the exposure radiation generated at exposure radiation source chamber 110. For example, in one implementation, the exposure radiation can be EUV radiation having a wavelength of about 13.5 nm and the probe radiation can have a wavelength between about 257 nm and about 633 nm.

Movable mirror 210 can be positioned in path 150 of the exposure radiation to direct the probe radiation generated by source 205 along path 150. When positioned in path 150, movable mirror 210 can block exposure radiation from exposing substrate 130. Mirror 210 can operate alone and/or in conjunction with a separate shutter to block exposure radiation from exposing substrate 130.

Probe radiation detector 215 measures the position and propagation direction of the probe radiation at substrate 130 to ensure that the probe radiation is properly positioned and directed. Probe radiation angle detector 215 includes a feducial mark 230, along with a radiation transducer and control electronics.

Interaction detector 220 includes one or more devices to detect the scattering of probe radiation off of latent images 225 and alignment marks 230 in substrate 130. For example, interaction detector 220 can include a charge coupled device, a photodiode, a photomultiplier tube, or other photodetector. Interaction detector 220 also includes control electronics to generate a control signal based on the intensity and position of the detected scatter.

Figure 3:
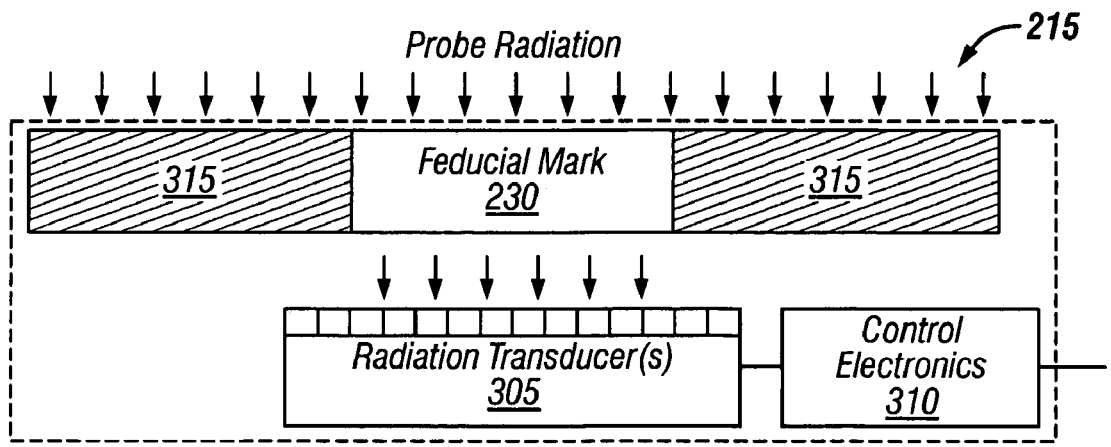
FIG. 3 shows an implementation of a detector of probe radiation.

FIG. 3 shows an implementation of probe radiation detector 215. In addition to feducial mark 230, detector 215 also includes one or more probe radiation transducers 305 and control electronics 310. Feducial mark 230 can be a window in a wafer stage or other opaque element 315 that is transparent to probe radiation. As such, when probe radiation illuminates opaque element 315, a portion of the probe radiation passes through feducial mark 230 to illuminate radiation transducer 305. The intensity of light measured at radiation transducer 305 can indicate the angle and/or position of the probe radiation at substrate 130. Control electronics 310 receives intensity measurement signals from radiation transducer 305 and uses the received information to generate a control signal to adjust the angle and position of movable mirror 210. Control electronics 310 can use the information received from radiation transducer 305 for closed loop control of the position and propagation direction of the probe radiation.

Figure 4:
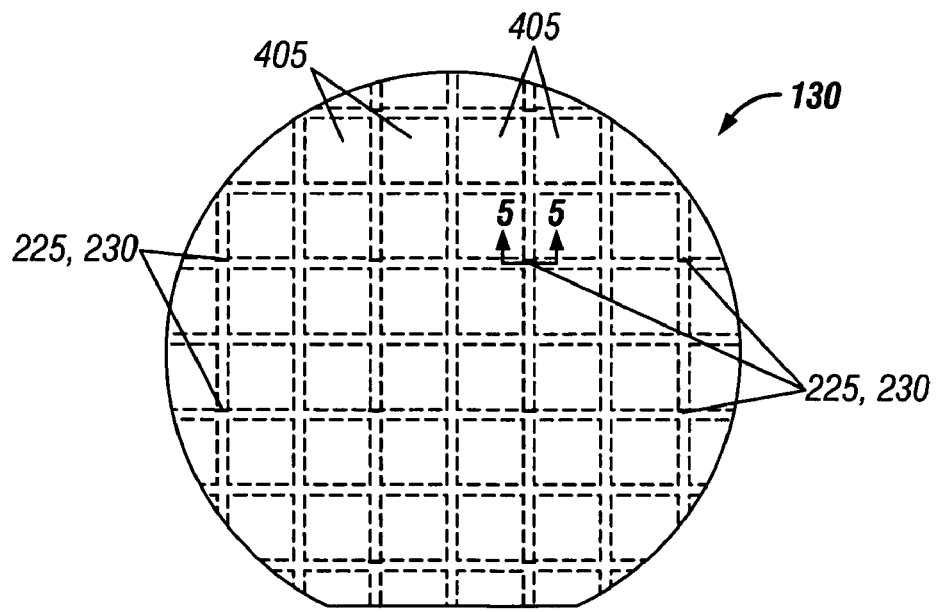
FIGS. 4 and 5 show one implementation of how latent images and alignment marks can be positioned on a substrate.
Figure 5:
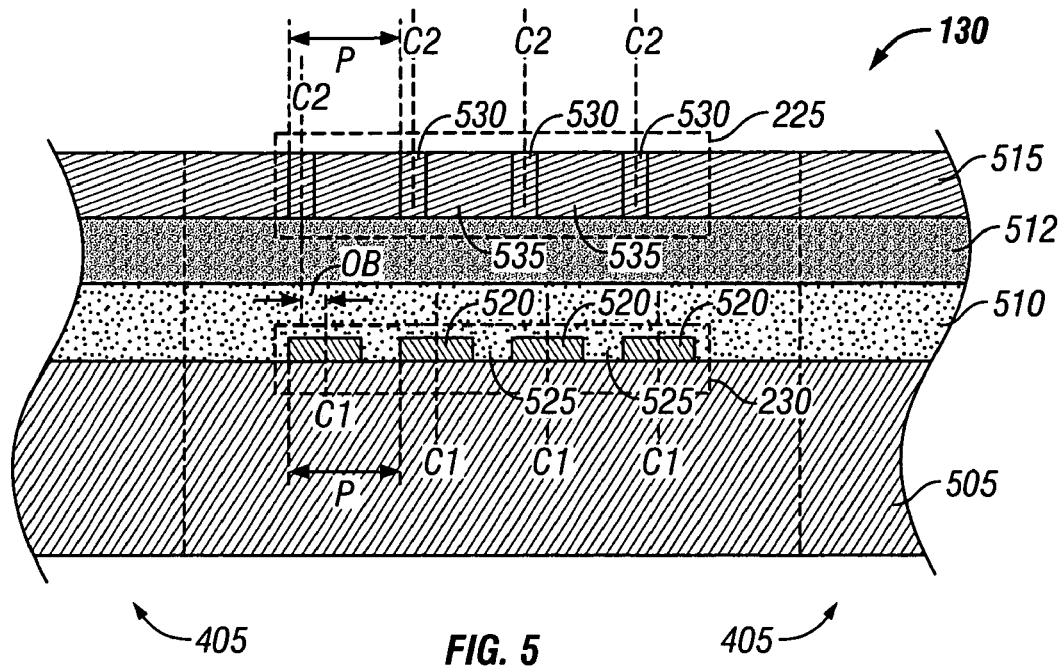

FIGS. 4 and 5 show one implementation of how latent images 225 and alignment marks 230 can be positioned on substrate 130.

Substrate 130 can be a semiconductor wafer that includes an array of die portions 405. Latent images 225 and alignment marks 230 can be positioned laterally between die portions 405. Latent images 225 and alignment marks 230 can be oriented in different directions at different locations on substrate 130.

At the processing stage shown in FIG. 5, substrate 130 includes layers 505, 510, 512, 515. Layer 505 can be the base wafer or another layer formed above a base wafer during previous processing. Layer 510 can include electrical insulators such as silicon oxide or nitride, semiconducting materials such as p- or n-doped silicon, or conducting materials such as copper or aluminum. For example, layer 510 can be an interlayer dielectric, an interconnect layer, a device layer, a resist layer, and/or a sacrificial layer. Layer 510 can transmit at least part of the probe radiation incident on substrate 130.

Layer 512 can include electrical insulators such as silicon oxide or nitride, semiconducting materials such as p- or n-doped silicon, or conducting materials such as copper or aluminum. For example, layer 512 can be an interlayer dielectric, an interconnect layer, a device layer, a resist layer, and/or a sacrificial layer. Layer 512 can transmit at least part of the probe radiation incident on substrate 130.

Layer 515 can include a photosensitive material that responds to exposure radiation generated at source chamber 110. For example, layer 515 can be positive or negative photoresist. Layers 510, 515 can separated by one or more intervening layers such as layer 512 (as shown) or layers 510, 515 can be contiguous. For example, layers 510, 515 can be contiguous during implantation of layer 515.

Alignment marks 230 can be formed above layer 505 from a material with optical properties that differ from the optical properties of layer 510. Alignment marks 230 can include a collection of alternating lines 520 and spaces 525 oriented substantially parallel to the surface of layer 505 and having a pitch P. Pitch P can be, e.g., tens or hundreds of nanometers. Each line 520 can be formed about a vertical centerplane C1 directed into and out of the page.

Photosensitive layer 515 includes latent image 225. Latent image 225 can be formed by exposing part of photosensitive layer 515, as discussed further below. Either of lines 530 and spaces 535 can correspond to exposed regions depending on whether latent image 225 is formed in a positive or a negative material (e.g., a positive or negative photoresist).

Latent image 225 can include a collection of alternating lines 530 and spaces 535 oriented substantially parallel to the surface of layer 505. Each line 530 can be formed about a vertical centerplane C2 directed into and out of the page. Centerplanes C2 can be substantially parallel to centerplanes C1. Lines 530 and spaces 535 can have the same pitch P as lines 520 and spaces 525.

Although lines 520, 530 and spaces 525, 535 can have the same pitch P, centerplanes C1, C2 need not align. For example, when lines 520, 530 and spaces 525, 535 are aligned perfectly (i.e., there is no overlay error in the direction of pitch P), centerplanes C1, C2 can be offset from one another by an offset bias OB. For example, centerplanes C1, C2 can be offset by an offset bias OB of one quarter of pitch P when lines 520, 530 and spaces 525, 535 are aligned perfectly.

FIGS. 6-9 show example top-down views of layouts of latent images 225 that can be included in substrate 130 to scatter probe radiation.

Figure 6:
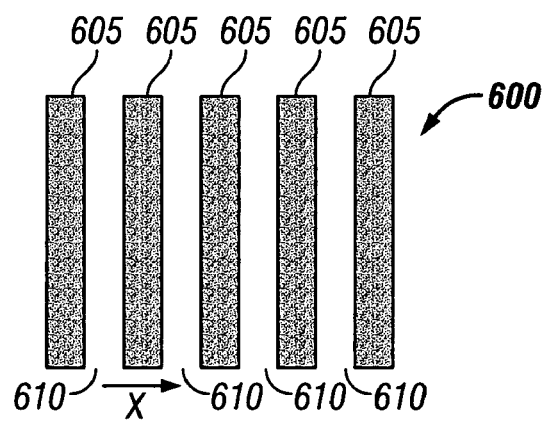
FIGS. 6-9 show example layouts of latent images and alignment mark from above.

FIG. 6 shows a layout 600 that includes an alternating series of lines 605 and spaces 610 that scatter light. Lines 605 have a different refractive index than spaces 610. Lines 605 and spaces 610 are substantially equally spaced in the X direction and can be produced using an exposure beam energy distribution that is essentially sinusoidal.

Figure 7:
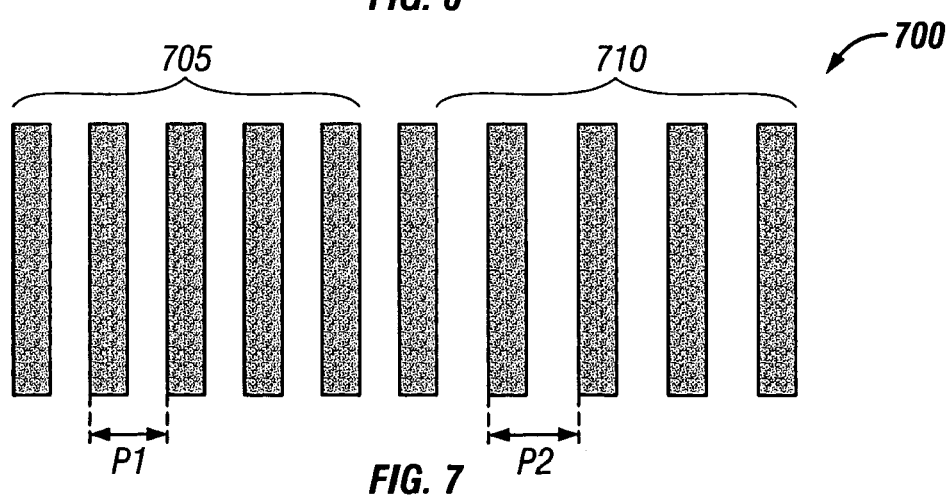

FIG. 7 shows a layout 700 that includes two collections 705, 710 of series of alternating lines and spaces with different refractive indices. Collection 705 has a pitch P1. Collection 710 has a pitch P2. Pitch P1 is smaller than the pitch P2. Collections 705, 710 can be produced using an exposure beam energy distribution that includes two essentially sinusoidal components at different locations.

Figure 8:
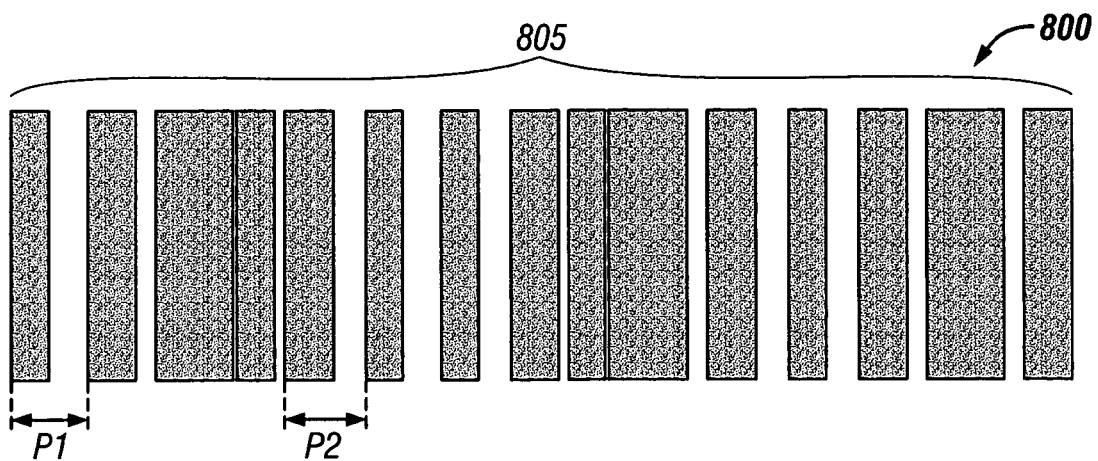

FIG. 8 shows a layout 800 that includes a single collection 805 of lines and spaces with different refractive indices arranged at two different pitches P1 and P2. Collection 805 can be produced using an exposure beam energy distribution that includes two essentially sinusoidal components at the same location.

Figure 9:
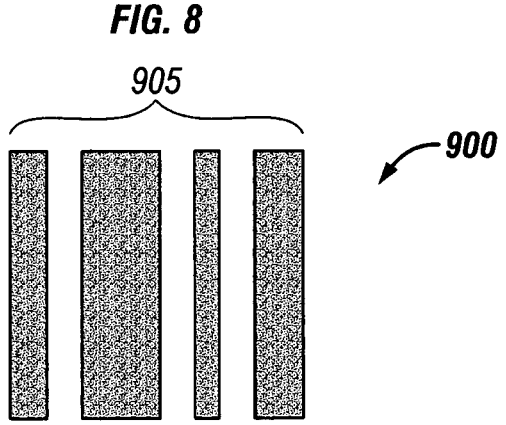

FIG. 9 shows a layout 900 that includes a collection 905 of nonperiodic features with different refractive indices. Collection 905 can scatter probe radiation and can be used to align the features in successive patterns.

Note that the different refractive indices in layouts 600, 700, 800, 900 can result from spatial distributions in chemical composition resulting from the exposure of a photosensitive medium to electromagnetic radiation. Note also that layouts comparable to layouts 600, 700, 800, 900 can be used for alignment marks 230.

In operation, reflective exposure system 100 can use one or more latent images 225 and alignment marks 230 to increase the accuracy of alignment between the features of successive patterns.

Figure 10:
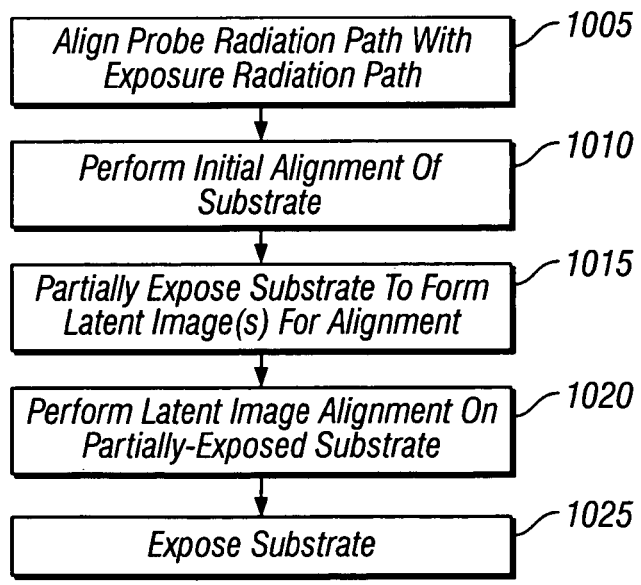
FIG. 10 is a flowchart of a process for alignment using latent images.

As shown in FIG. 10, the path of probe radiation can be aligned with the path of the exposure radiation at block 1005. In one implementation, movable mirror 210 can be positioned in exposure path 150. If another shutter is available, the shutter can also be used to interrupt the flux of exposure radiation along path 150.

Probe radiation source 205 can then generate probe radiation. At probe radiation detector 215, at least a portion of the generated probe radiation passes through to radiation transducer(s) 305 and the position and propagation direction of the probe radiation is measured. Control electronics 310 generates a control signal to reposition movable mirror 210 to ensure that the position and propagation direction of the probe radiation are correct. Control electronics 310 can thus ensure that the probe radiation substantially is aligned with path 150.

Once movable mirror 210 is properly positioned, probe radiation source 205 can be turned off or otherwise blocked and substrate can be subject to an initial alignment at block 1010. In one implementation, the initial alignment can include positioning a wafer or other substrate that includes both alignment marks 230 and an unexposed photosensitive layer in system 100. The substrate can be coarsely and finely aligned. Alignment marks 230 can be previously formed using system 100 or marks 230 can be formed using a different system. The initial alignment can be performed using, e.g., a wafer pre-aligner and a wafer alignment system. The alignment accuracy can be sufficient to ensure that the substrate is within one pitch of the largest pitch of a periodic pattern in alignment marks 230.

Once the initial alignment is performed, the substrate can be partially exposed to form one or more latent images 225 for alignment at block 1015. In one implementation, a reticle 120 that causes exposure radiation traveling along path 150 to form one or more latent images 225 at the substrate is deployed in system 100. Reticle 120 can also include portions for the successive exposure and patterning of substrate 130. However, these portions can be shielded so that successive exposure of substrate 130 does not occur during the formation of latent images 225. For example, the portions for successive exposure and patterning can be shielded using mask blinds so that die portions 405 are unexposed during the formation of latent images 225.

Using the shielded reticle 120, substrate 130 is partially exposed to form latent image(s) 225 in layer 515. Other portions of layer 515 of substrate 130 that are to be successively exposed and patterned can remain unexposed.

Latent image alignment system 200 can then use latent image 225 and alignment marks 230 to perform latent image alignment using partially exposed substrate 130 at block 1020. Such latent image alignment can more accurately align substrate 130 for successive patterning.

In one implementation, substrate 130 is illuminated by probe radiation aligned with path 130. The probe radiation interacts with one or more alignment mark(s) 230 and latent images 225 on substrate 130. Interaction detector 220 detects the interaction of the probe radiation with alignment marks 230 and latent images 225. Interaction detector 220 can include multiple photodetector elements and/or can be repositionable to interrogate the interaction at multiple angles. Latent image alignment system 200 can also include mirrors and/or other optical elements to direct probe radiation to interaction detector 220.

Figure 11:
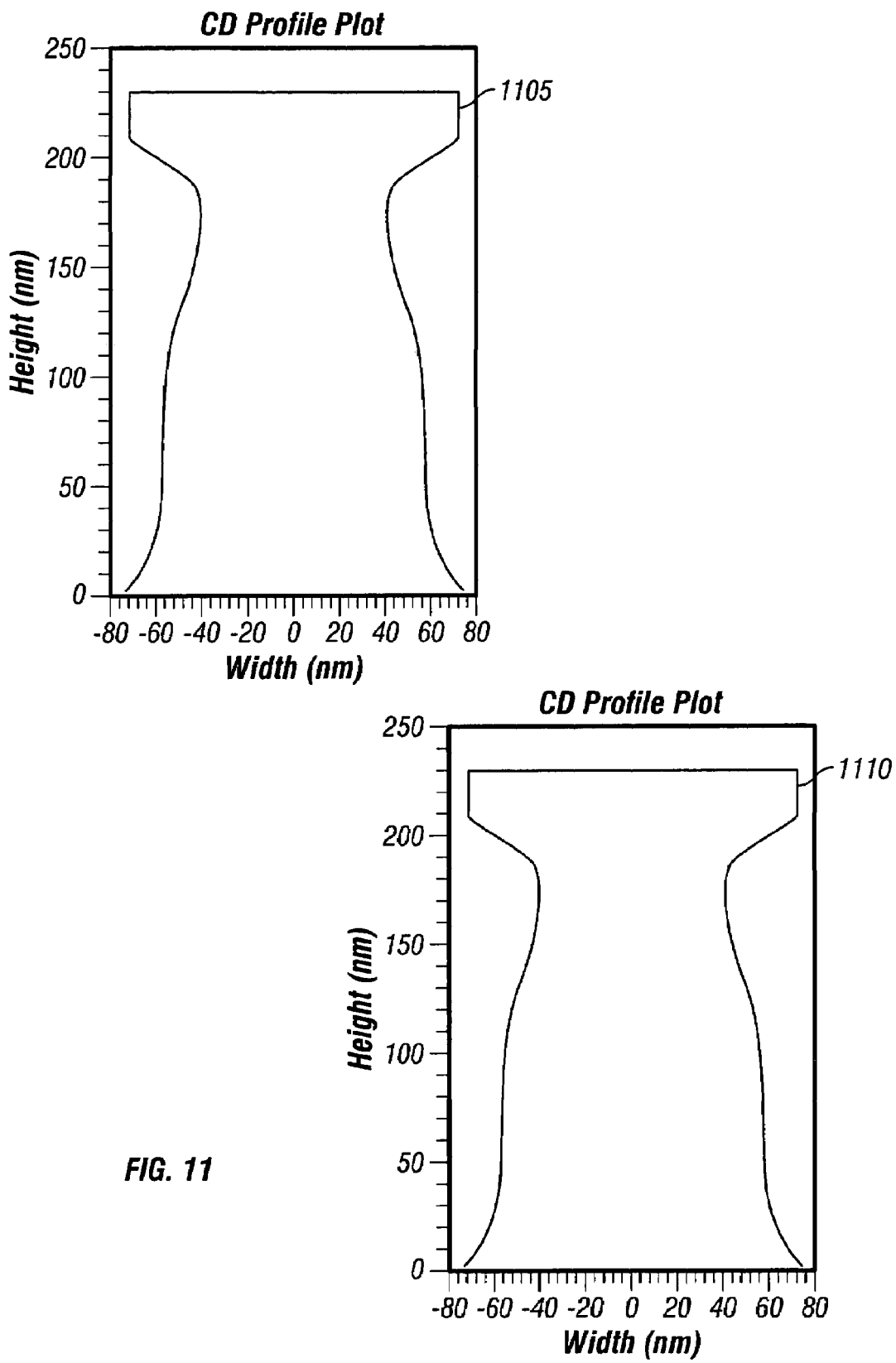
FIG. 11 shows example critical dimension (CD) profiles obtained using a scatterometer and a grating latent image.
Figure 11:
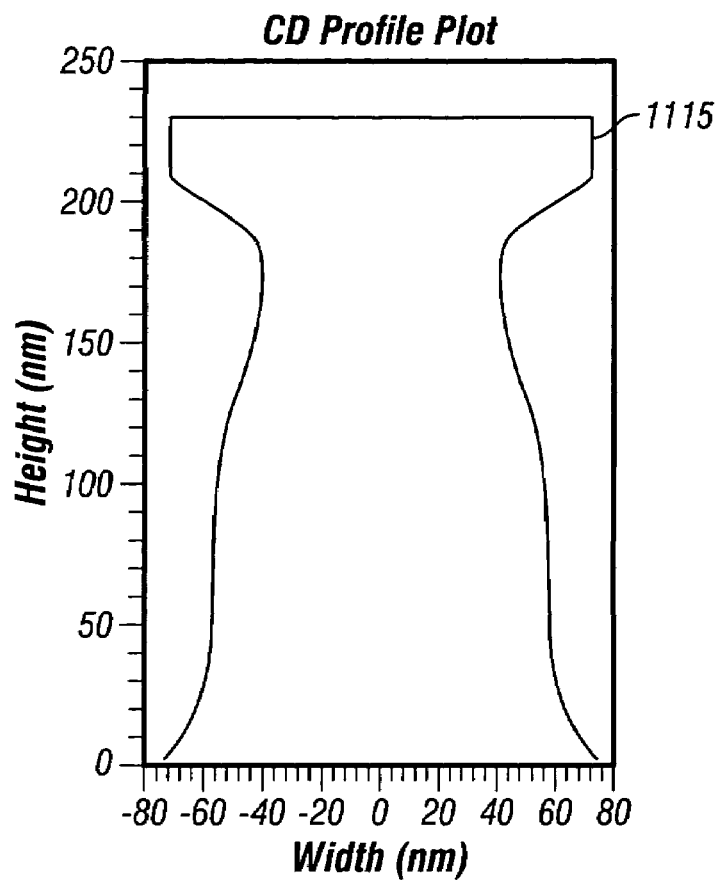
Figure 11:
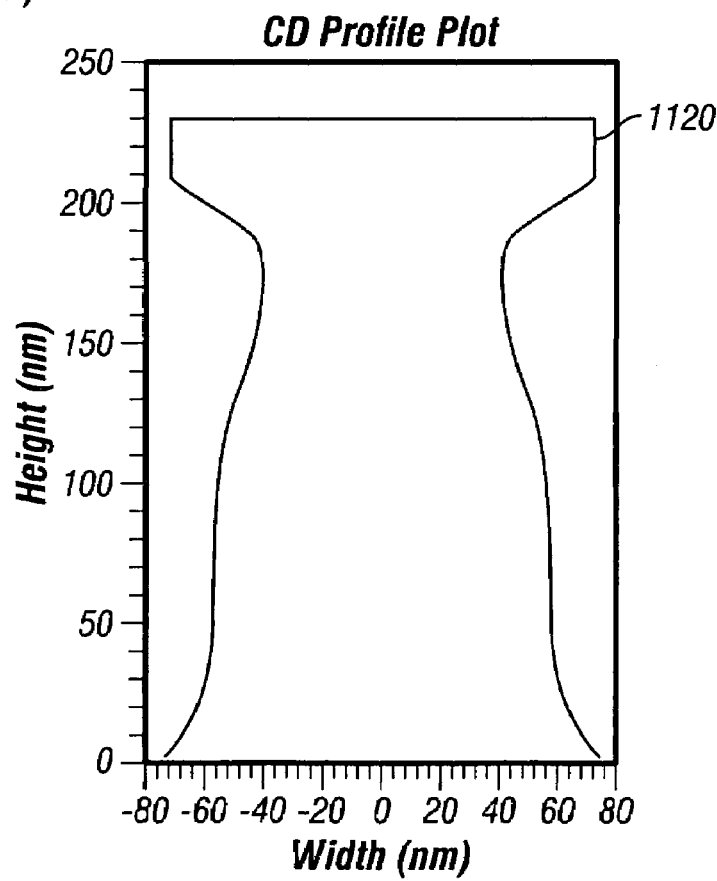

FIG. 11 shows example critical dimension (CD) profiles 1105, 1110, 1115, 1120 of the interaction between probe radiation and latent images. Profiles 1105, 1110, 1115, 1120 were obtained using a commercially available scatterometer and a grating latent image laid out like layout 600 in FIG. 6.

Once interaction detector 220 physically detects the interaction between probe radiation, alignment marks 230, and latent images 225, the position of alignment marks 230 relative to latent images 225 can be determined using a number of different approaches. For example, rigorous coupled wave analysis (RCWA) based on geometric models of alignment marks 230 and latent images 225 can be used to determine any overlay errors between alignment marks 230 and latent images 225. As another example, a pair of collections of alignment marks 230 and latent images 225 can be placed in the same vicinity on substrate 130 to have substantially the same thicknesses and line profiles. Differential measurements that exploit the reflection symmetry along the pitch direction can be used to determine the relative overlay errors of the pair. Further examples include multi-spectral regression and linear differential estimation. Examples of other techniques for determining the position of alignment marks 230 relative to latent images 225 are described, e.g., in the publication entitled "Scatterometry-Based Overlay Metrology" by H.-T. Huang et al. (SPIE Proceedings Vol. 5038 "Metrology, Inspection and Process Control for Microlithography XVII," Santa Clara, Calif., February 24-27, pp. 126-137, 2003).

Returning to FIG. 10, when the position of alignment marks 230 relative to latent images 225 is determined, interaction detector 220 can, if needed, generate a control signal that directs fine alignment stage 140 to reposition substrate 130. This repositioning can more accurately align substrate 130 relative to exposure radiation path 150. With substrate 130 properly positioned, probe radiation can be prevented from illuminating substrate 130.

Substrate 130 can then be exposed to form features and patterns for successive patterning at block 1015. In one implementation, exposure radiation traveling along path 150 forms a new collection of latent images in layer 515 on substrate 130. The new collection of latent images can be used to form microelectronic devices. The new collection of latent images can include features in die portions 405.

Since substrate 130 is more closely aligned relative to path 150, the new collection of latent images can be more closely aligned with previous or subsequent exposure patterns.

A number of implementations have been described. Nevertheless, it will be understood that various modifications may be made. A variety of systems for patterning a substrate can be used. As examples, a plasma in source chamber 110 can be excited by a pulsed electrical discharge rather than a laser. Source chamber 110 can include solid or gaseous targets to be excited by laser 105. Alternatively, a discharge plasma source can be used as an EUV source.

Latent images 225 need not be an alternating series of lines and spaces. For example, latent images 225 can be any of a number of repetitive patterns or latent images 225 can be a periodic.

In some implementations, an outer layer (e.g., layer 515 in FIG. 5) includes a latent image that is used in alignment. In other implementations, latent images are found in multiple layers on a substrate. Latent images in a first layer may be oriented in a first direction and latent images in a second layer may be oriented in a second direction, and two different scatter detectors may be used to ensure alignment in both directions.

Rather than scatterometry, other optical techniques can be used to detect the position of latent images on a substrate.

Accordingly, other implementations are within the scope of the following claims.

What is claimed is:

1. A method comprising:
   detecting a location of a latent image having a repeating pattern on a substrate using scatterometry, wherein scatterometry includes
   illuminating the repeating pattern of the latent image and a repeating pattern of an alignment mark with a probe electromagnetic radiation, and
   detecting an optical response of the repeating patterns of the latent image and the alignment mark to the probe electromagnetic radiation;
   repositioning the substrate based on the detected location of the latent image; and
   patterning the substrate.

2. The method of claim 1, further comprising:
   initially aligning the substrate in a patterning system before detecting the location of the latent image.

3. The method of claim 1, wherein detecting the location of the latent image comprises detecting an overlay error between the latent image and another feature on the substrate.

4. The method of claim 1, detecting the optical response comprises:
   detecting a first optical response at a first position relative to the substrate; and
   detecting a second optical response at a second position relative to the substrate.

5. The method of claim 1, further comprising controlling at least one of a position and a propagation direction of the probe electromagnetic radiation.

6. The method of claim 5, wherein controlling the at least one of the position and the propagation direction comprises changing a position of a mirror reflecting the probe electromagnetic radiation.

7. The method of claim 1, further comprising exposing a photosensitive material on the substrate using an extreme ultraviolet (EUV) light to form the latent image.

8. The method of claim 7, wherein detecting the location of the latent image comprises illuminating the latent image with an electromagnetic radiation having a wavelength longer than a wavelength of the extreme ultraviolet (EUV) light.

9. The method of claim 1, wherein detecting the location of the latent image comprises detecting the location of the latent image on a substrate positioned in a reflective exposure system.

10. The method of claim 1, further comprising varying a frequency of the probe radiation to perform spectroscopic scatterometry.

11. The method of claim 1, further comprising exposing a photosensitive material on the substrate to form a collection of latent images, each latent image including a repeating pattern of features.

12. The method of claim 1, further comprising:
    exposing first regions of a layer of an energy-sensitive medium on a substrate to generate the latent image; and
    after the repositioning, exposing second regions of the layer of the energy-sensitive medium to pattern the substrate for a microelectronic device,
    wherein the first regions of the layer are different from the second regions of the layer.

13. The method of claim 12, wherein:
    exposing the first regions comprises blocking a first portion of a mask; and
    exposing the second regions comprises exposing the second regions using the first portion of the mask.

14. The method of claim 13, wherein blocking the first portion of the reticle comprises shielding the first portion of the mask using a mask blind.

15. A system, comprising:
    a substrate positioner to support and position a substrate;
    an exposure electromagnetic radiation source to generate an exposure radiation to expose an energy sensitive material at a supported substrate;
    a probe electromagnetic radiation source to generate a probe electromagnetic radiation to interact with a latent image at a supported substrate;
    a scatterometry system to detect the interaction of the electromagnetic radiation with the latent image; and
    a positioning signal generator to generate a signal directing the substrate positioner to reposition a supported substrate based on the detected interaction between the electromagnetic radiation and the latent image.

16. The system of claim 15, wherein the probe electromagnetic radiation source comprises a laser light source.

17. The system of claim 15, wherein positioning signal generator comprises an open loop control system.

18. The system of claim 15, wherein the substrate positioner comprises:
    a wafer chuck; and
    a translation stage.

19. The system of claim 15, further comprising the supported substrate, the substrate including the latent image and an alignment mark.

20. The system of claim 15, wherein the system comprises a reflective exposure system.

21. The system of claim 15, wherein the scatterometry system comprises a spectroscopic scatterometer.

22. The system of claim 15, further comprising:
    a mask that includes a first collection of features arranged to expose the energy sensitive material with a collection of alignment features and a second collection of features arranged to expose the energy sensitive material with a pattern for forming a microelectronic circuit; and
    a mask blind positionable to block the simultaneous exposure of the energy sensitive material by both the first collection of features and the second collection of features.

23. An apparatus comprising:
    a substrate including a energy-sensitive medium, the substrate comprising
    a collection of latent images in the energy-sensitive medium, each latent image comprising a repeating pattern to scatter the probe electromagnetic radiation, a collection of alignment marks outside the energy-sensitive medium, each mark comprising a repeating pattern to scatter the probe electromagnetic radiation, and an unexposed region in the energy-sensitive medium and available for patterning a microelectronic device by exposure to an exposing energy, wherein the latent image and the alignment mark are to interact with a probe electromagnetic radiation.

24. The apparatus of claim 23, wherein the latent image is disposed above the alignment mark on the substrate.

25. The apparatus of claim 23, wherein the repeating patterns of each image and the repeating patterns of each mark comprise an alternating series of lines and spaces having a same pitch but a different centerplane.

26. The apparatus of claim 23, wherein the repeating patterns of each image and the repeating patterns of each mark each comprise features having at least two different pitches.

27. The apparatus of claim 23, wherein the energy-sensitive medium includes at least two latent images oriented in different directions.

28. The apparatus of claim 23, further comprising an at least partially transparent layer disposed between the latent image and the alignment mark.

29. The apparatus of claim 23, wherein:

the substrate includes die portions; and the latent image is disposed between die portions.

30. The apparatus of claim 23, wherein:

the substrate further comprises a first collection of latent pattern images in the energy-sensitive medium, the latent pattern images including a pattern for fashioning a microelectronic device; and the collection of latent images comprises first collection of latent alignment images in the energy-sensitive medium, and a second collection of latent alignment images in the energy-sensitive medium, wherein the latent alignment images in the second collection correspond with the latent alignment images in the first collection but are displaced relative thereto.

* * * * *